US010832870B2

(12) United States Patent
Slagle et al.

(10) Patent No.: US 10,832,870 B2
(45) Date of Patent: Nov. 10, 2020

(54) METHOD AND SYSTEM FOR REDUCING AUDIBLE AND/OR ELECTRICAL NOISE FROM ELECTRICALLY OR MECHANICALLY EXCITED CAPACITORS

(71) Applicant: Allison Transmission, Inc., Indianapolis, IN (US)

(72) Inventors: Steven D. Slagle, Indianapolis, IN (US); James D. Shaw, Carmel, IN (US); George C. Mimms, Indianapolis, IN (US); Kyle E. Erickson, Avon, IN (US)

(73) Assignee: ALLISON TRANSMISSION, INC., Indianapolis, IN (US)

( * ) Notice: Subject to any disclaimer, the term of this patent is extended or adjusted under 35 U.S.C. 154(b) by 0 days.

(21) Appl. No.: 15/810,782

(22) Filed: Nov. 13, 2017

(65) Prior Publication Data

US 2018/0068799 A1 Mar. 8, 2018

Related U.S. Application Data

(60) Continuation of application No. 14/694,437, filed on Apr. 23, 2015, now abandoned, which is a division of
(Continued)

(51) Int. Cl.
*H01G 4/35* (2006.01)
*H05K 1/18* (2006.01)
(Continued)

(52) U.S. Cl.
CPC .......... *H01G 4/35* (2013.01); *F16H 57/0006* (2013.01); *H01G 2/065* (2013.01); *H01G 4/12* (2013.01);
(Continued)

(58) Field of Classification Search
CPC .. H01G 4/30; H01G 4/38; H01G 4/40; H05K 1/18; H05K 2201/2045
See application file for complete search history.

(56) References Cited

U.S. PATENT DOCUMENTS 4,959,786 A * 9/1990 Glowczewski ......... F16H 61/00
701/112
5,155,655 A 10/1992 Howard et al.
(Continued)

FOREIGN PATENT DOCUMENTS

DE       10207957 A1   10/2002
JP        2002217667 A   8/2002
KR       100415799 B1   1/2004

OTHER PUBLICATIONS

ISA/KR (KIPO): "Notification of Transmittal of the International Search Report and the Written Opinion of the International Searching Authority, or the Declaration" issued in International Application No. PCT/US2013/056737; dated Nov. 27, 2013; pp. 1-15.
(Continued)

*Primary Examiner* — Timothy J Thompson
*Assistant Examiner* — Rhadames Alonso Miller
(74) *Attorney, Agent, or Firm* — Taft Stettinius & Hollister LLP; Stephen F. Rost

(57) ABSTRACT

Devices and methods are disclosed for reducing vibration and noise from capacitor devices. The device includes a circuit board, and first and second capacitor structures. The second capacitor structure has substantially the same properties as the first and is coupled to the opposite face of a supporting structure substantially opposite of the first capacitor structure. The first and second capacitor structures can receive substantially the same excitation signals, can be electrically connected in parallel or in series. The first and second capacitor structures can be discrete capacitors, capacitor layers, stacks or arrays of multiple capacitor
(Continued)

devices, or other capacitor structures. Stacks of multiple capacitor devices can be arranged symmetrically about the supporting structure. Arrays of multiple capacitor devices can be arranged with offsetting capacitors on the opposite face of the supporting structure substantially opposite one another.

12 Claims, 2 Drawing Sheets

Related U.S. Application Data application No. 14/010,772, filed on Aug. 27, 2013, now abandoned.

(60) Provisional application No. 61/694,827, filed on Aug. 30, 2012.

(51) Int. Cl.
| | |
|---|---|
| *H05K 3/30* | (2006.01) |
| *H01G 4/40* | (2006.01) |
| *F16H 57/00* | (2012.01) |
| *H01G 2/06* | (2006.01) |
| *H01G 4/12* | (2006.01) |
| *H01G 4/30* | (2006.01) |
| *H01G 4/38* | (2006.01) |
| *H05K 1/02* | (2006.01) |

(52) U.S. Cl.
CPC ............... *H01G 4/30* (2013.01); *H01G 4/38* (2013.01); *H01G 4/40* (2013.01); *H05K 1/18* (2013.01); *H05K 1/181* (2013.01); *H05K 3/30* (2013.01); *H05K 1/0231* (2013.01); *H05K 2201/10015* (2013.01); *H05K 2201/10515* (2013.01); *H05K 2201/10545* (2013.01); *H05K 2201/2045* (2013.01); *H05K 2203/1572* (2013.01); *Y02P 70/50* (2015.11); *Y10T 29/4913* (2015.01)

(56) References Cited

U.S. PATENT DOCUMENTS

| | | | |
|---|---|---|---|
| 5,261,153 A | 11/1993 | Lucas | |
| 5,824,903 A | 10/1998 | Nakamura et al. | |
| 5,838,216 A | 11/1998 | White et al. | |
| 5,909,350 A | 6/1999 | Anthony | |
| 6,011,683 A | 1/2000 | Dat | |
| 6,304,425 B1* | 10/2001 | Mamada | H05K 1/181 |
| | | | 361/320 |
| 6,336,365 B1 | 1/2002 | Blackadar et al. | |
| 6,618,266 B2 | 9/2003 | Blakely et al. | |
| 6,822,845 B2 | 11/2004 | Chereson | |
| 6,860,954 B2 | 3/2005 | Mamada | |
| 6,954,346 B2 | 10/2005 | Anthony | |
| 8,564,966 B2* | 10/2013 | Kitagawa | H05K 1/0231 |
| | | | 361/306.2 |
| 2002/0007908 A1 | 1/2002 | Mamada | |
| 2002/0172023 A1 | 11/2002 | Blakely et al. | |
| 2003/0107869 A1 | 6/2003 | Jackson et al. | |
| 2003/0224546 A1 | 12/2003 | Chen et al. | |
| 2005/0270749 A1 | 12/2005 | Verbist | |
| 2006/0092595 A1 | 5/2006 | Lee et al. | |
| 2006/0143887 A1 | 7/2006 | Srinivasan et al. | |
| 2008/0125267 A1 | 5/2008 | Dourra et al. | |
| 2009/0213564 A1* | 8/2009 | Kakuda | B60L 3/0092 |
| | | | 361/811 |
| 2012/0123654 A1 | 5/2012 | Byerly et al. | |
| 2012/0125674 A1 | 5/2012 | Miyahara et al. | |
| 2013/0193582 A1 | 8/2013 | Choi | |
| 2013/0222045 A1 | 8/2013 | Wu | |
| 2013/0265726 A1 | 10/2013 | Murai et al. | |
| 2014/0060911 A1 | 3/2014 | Slagle et al. | |
| 2014/0332261 A1 | 11/2014 | Fujimoto et al. | |

OTHER PUBLICATIONS

European Patent Office; "European Search Report" issued in Application No. 13834095.5; dated Jun. 21, 2016; 8 Pages.
Extended European Search Report, European Patent Office, European Application No. 19163294.2, dated Jul. 22, 2019, 9 pages.
Korean Office Action, Korean Intellectual Property Office, Korean Application No. 10-2015-7008027, dated Dec. 12, 2019, 9 pages.

* cited by examiner

METHOD AND SYSTEM FOR REDUCING AUDIBLE AND/OR ELECTRICAL NOISE FROM ELECTRICALLY OR MECHANICALLY EXCITED CAPACITORS

CROSS-REFERENCE TO RELATED APPLICATIONS

This application is a continuation application of U.S. patent application Ser. No. 14/694,437, filed Apr. 23, 2015, which is a divisional application of U.S. patent application Ser. No. 14/010,772, filed Aug. 27, 2013, which claims priority to U.S. Provisional Application No. 61/694,827, filed Aug. 30, 2012 and entitled "Method of Reducing Audible and Electrical Noise From Electrically or Mechanically Excited Capacitors," the disclosures of which are incorporated herein in their entirety by reference.

FIELD OF THE DISCLOSURE

The present invention relates to circuit boards and in particular to the arrangement of capacitors on circuit hoards.

BACKGROUND

Some capacitors, for example ceramic capacitors, can exhibit the undesirable side effect of generating audible noise when excited by time varying voltages with frequencies in the audible frequency range. These capacitors are usually constructed with ceramic materials that exhibit piezoelectric changes in their dimensions under the influence of electric fields. The surface area of the capacitor itself is normally small compared to the objectionable acoustic wavelengths. Thus, the capacitors by themselves are relatively poor generators of the undesirable audible noise or sound pressures. However, when the capacitor is mounted to a circuit board, the circuit board presents a relatively large surface area, and the vibrations from the capacitor can be transmitted into the circuit board causing its larger surface area to create sound levels significant enough to be objectionable. The larger vibrating surface area of the circuit board stimulated by the vibration of the capacitor can create significant sound pressure.

Some capacitors, for example piezoelectric capacitors, can generate electrical noise when they are excited by mechanical vibrations. The resulting mechanical strain applied to these capacitors has the potential of producing undesirable voltages across the capacitor terminals which can corrupt signals of interest in the circuits where these capacitors are used.

It would be desirable to reduce or eliminate undesirable audible and electrical noise generated by electrically or mechanically excited capacitors mounted on a circuit board.

SUMMARY

An electronic device is disclosed for reducing audible and/or electrical noise from electrically or mechanically excited capacitors. The electronic device includes a supporting structure, a first capacitor structure and a second capacitor structure. The supporting structure has a top face and a bottom face, the bottom face being opposite the top face. The first capacitor structure is coupled to the top face of the supporting structure, and the second capacitor structure is coupled to the bottom face of the supporting structure substantially opposite of the first capacitor structure. The second capacitor structure has substantially similar properties to the first capacitor structure.

The first and second capacitor structures can receive substantially the same excitation signal. The first and second capacitor structures can be electrically connected in parallel or in series. The first and second capacitor structures can be discrete capacitors, and can be ceramic capacitors. The supporting structure can be a circuit hoard, and the first capacitor structure can be mounted on the top face of the circuit board and the second capacitor structure can be mounted on the bottom face of the circuit board substantially opposite of the first capacitor structure.

Each of the first and second capacitor structures can include stacks of multiple capacitors, and the stacks of multiple capacitors can be substantially symmetric with one another about the supporting structure. Each of the first and second capacitor structures can include stacks of capacitor layers, and the stacks of capacitor layers be substantially symmetric with one another about the supporting structure. Each of the first and second capacitor structures can include arrays of multiple capacitor devices, and for each individual capacitor device of the first capacitor array, the second capacitor array can include a substantially similar capacitor device, the substantially similar capacitor device of the second capacitor array being coupled on the opposite side of the supporting structure substantially opposite from the individual capacitor device of the first capacitor array.

A method is disclosed for reducing audible and/or electrical noise from electrically or mechanically excited capacitors in an electronic device. The method includes positioning a first capacitor structure on a top face of a supporting structure, and positioning a second capacitor structure having substantially similar properties as the first capacitor structure on a bottom face of the supporting structure substantially opposite of the position of the first capacitor structure. Vibrations of the first capacitor structure can substantially cancel vibrations of the second capacitor structure. The method can include electrically connecting the first and second capacitor structures to receive substantially the same excitation signals, electrically connecting the second capacitor structure in parallel with the first capacitor structure, and/or electrically connecting the second capacitor structure in series with the first capacitor structure. The supporting structure can be a circuit board, and positioning the first capacitor structure can include mounting the first capacitor structure on the top thee of the circuit board, and positioning the second capacitor structure can include mounting the second capacitor structure on the bottom face of the circuit board substantially opposite of the position of the first capacitor structure.

The method can include stacking a first set of multiple capacitor devices to form the first capacitor structure, and stacking a second set of multiple capacitor devices to form the second capacitor structure. Stacking the second set of multiple capacitor devices can include stacking the second set of multiple capacitor devices such that the individual capacitor devices of the second set of multiple capacitor devices and the individual capacitor devices of the first set of multiple capacitor devices are substantially symmetric with one another about the supporting structure. The method can include arranging a first array of multiple capacitor devices to form the first capacitor structure, and arranging a second array of multiple capacitor devices to form the second capacitor structure. Arranging the second array of multiple capacitor devices can include arranging the second array of multiple capacitor devices such that for each individual capacitor device of the first array of multiple capacitor devices, the second array of multiple capacitor devices includes a substantially similar capacitor device, the substantially similar capacitor device of the second array of multiple capacitor devices being coupled to the opposite side of the supporting structure substantially opposite from the individual capacitor device of the first array of multiple capacitor devices.

BRIEF DESCRIPTION OF THE DRAWINGS

The above-mentioned aspects of the present invention and the manner of obtaining them will become more apparent and the invention itself will be better understood by reference to the following description of the embodiments of the invention, taken in conjunction with the accompanying drawings, wherein.

Corresponding reference numerals are used to indicate corresponding parts throughout the several views.

DETAILED DESCRIPTION

The embodiments of the present invention described below are not intended to be exhaustive or to limit the invention to the precise forms disclosed in the following detailed description. Rather, the embodiments are chosen and described so that others skilled in the art may appreciate and understand the principles and practices of the present invention.

Undesirable audible and electrical noise can be generated by capacitors mounted on a circuit board. For example, ceramic capacitors with large capacitance values can exhibit the undesirable side effect of audible noise generation when excited by time varying voltages causing the capacitor to vibrate in the audible frequency range. The dielectric layers of a ceramic capacitor can have inherent piezoelectric properties where the capacitor can exhibit piezoelectric changes in its dimensions under the influence of electric fields and start to vibrate when time-varying voltages are applied to the capacitor. These mechanical vibrations can be communicated to the circuit board on which the capacitor is mounted producing acoustic waves and undesirable noise generation. This undesirable audible noise can be reduced or eliminated by mounting substantially similar capacitors on opposite sides of the circuit board, electrically connected with either series or parallel connections, such that the mechanical forces applied to the circuit board by one capacitor are opposed or cancelled by the mechanical forces applied to the opposite side of the circuit board by the other capacitor.

Figure 1:
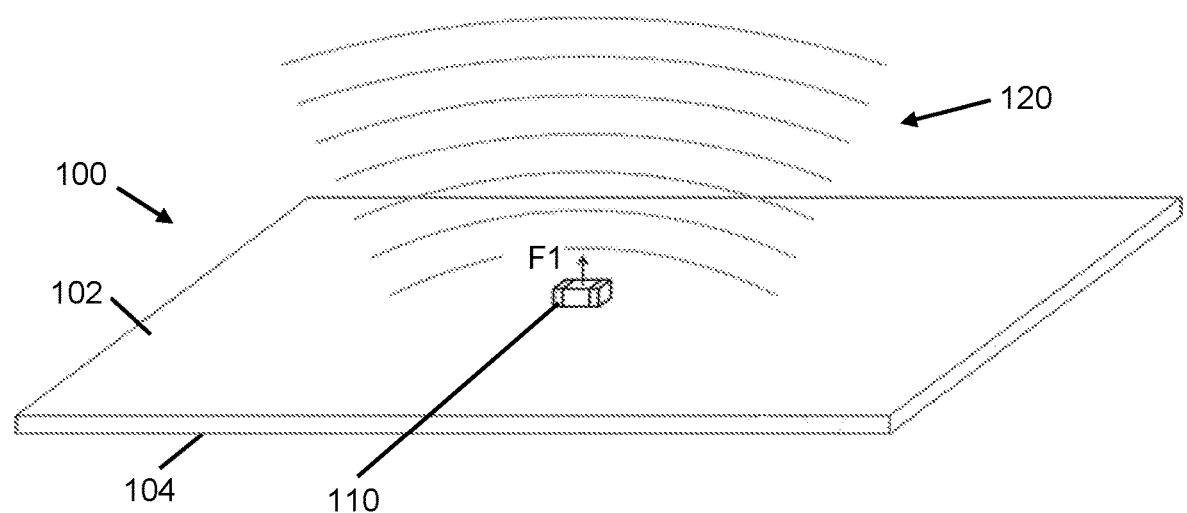
FIG. 1 is an exemplary illustration of a capacitor mounted on the top face of circuit board.

FIG. 1 shows an exemplary circuit board 100 and capacitor 110. The circuit board 100 has a top face 102 and a bottom face 104. The capacitor 110 is mounted on the top thee 102 of the circuit board 100. When the capacitor 110 is energized by time varying voltages with frequency content in the audible frequency range, piezoelectric acceleration forces F1 can cause the excited capacitor 110 to vibrate at frequencies within the audible range. The surface area of the capacitor 110 is normally small compared to the wavelengths of objectionable acoustic waves, so the capacitor 110 by itself is a relatively poor generator of undesirable audible noise. However, when mounted, for example by soldering, to the circuit board 100, the circuit board 100 presents a relatively large surface area. The piezoelectric acceleration forces F1 from the excited capacitor 110 can be transmitted into the circuit board 100 causing its larger surface area to vibrate and generate acoustic waves 120 that produce audible sound levels significant enough to be objectionable.

The placement of capacitors on circuit boards is typically not based on the placement of other capacitors on the opposite side of the circuit board, but rather on considerations such as available board space, proximity to other circuit elements, etc. However, mounting substantially similar capacitors on the opposite sides of a circuit board and exposing the substantially similar capacitors to substantially similar electrical stimulation can reduce or eliminate the unwanted vibrations in the circuit board.

Figure 2:
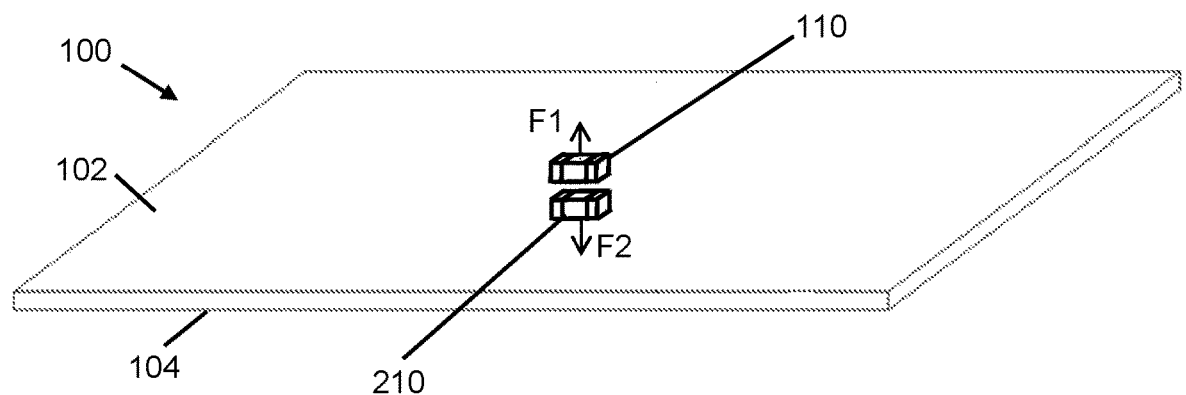
FIG. 2 is an exemplary illustration of a capacitor mounted on the top face of a circuit board and a substantially similar opposing capacitor mounted on the bottom face of the circuit board.

FIG. 2 is similar to FIG. 1 except that it also includes a substantially similar, opposing capacitor 210 mounted on the bottom face 104 of the circuit board 100 directly opposite the capacitor 110 which is mounted on the top face 102 of the circuit board 100. By locating substantially similar capacitors 110, 210 substantially opposite one another on opposite sides of the circuit board 100 and providing substantially similar electrical stimulation, the piezoelectric acceleration forces F1 and F2, produced by the substantially capacitors 110, 210 oppose each other's ability to vibrate the circuit board 100. When the capacitor 110 is energized by time varying voltages, piezoelectric acceleration forces F1 can cause the excited capacitor 110 to vibrate at frequencies within the audible range. These piezoelectric acceleration forces F1 from the excited capacitor 110 can be transmitted into the circuit hoard 100 causing its larger surface area to vibrate and generate acoustic waves 120 as shown in FIG. 1. However, by routing the same or substantially similar time varying voltages to energize the substantially similar, opposing capacitor 210, the opposing capacitor 210 produces piezoelectric acceleration forces F2 causing the excited opposing capacitor 210 to vibrate at substantially the same frequencies in the opposite direction. The piezoelectric acceleration forces F2 from the opposing capacitor 210 tend to cancel the acceleration forces F1 from the capacitor 110 reducing or eliminating vibrations in the circuit board 100 that generate undesirable acoustic waves. By reducing or eliminating the circuit board vibration, significant noise reduction can be realized.

Some capacitors, for example piezoelectric capacitors, can generate electrical noise when excited by mechanical vibrations. The resulting mechanical strain applied to these capacitors has the potential of producing undesirable voltages across the capacitor terminals winch can corrupt signals of interest in the circuits where these capacitors are used. This problem can be reduced or eliminated when similar capacitors are mounted on opposite sides of the circuit board and electrically connected, as previously described, such that there is cancellation of the mechanical vibrations of the capacitors. When circuit boards communicate mechanical vibrations to capacitors mounted on opposite sides of a circuit board, with an opposite phase, the undesirable voltages generated by the capacitors can cancel each other reducing their effect on thee signals of interest.

A stack with an even number of two or more substantially similar discrete capacitors, or sets of capacitor layers, can be constructed such that the stack is supported by a circuit board or other structure in the middle of the stack such that the stack of capacitors or capacitor layers is substantially symmetrical about the support structure, and the terminals are designed to provide substantially the same electrical stimulation to both sides of the stack. FIG. 2 shows an exemplary stack of two substantially similar capacitors 110, 210 which can be illustrative of more complex capacitor structures in which each of the capacitors 110, 210 represents stacks of capacitors or sets of capacitor layers that are substantially symmetrical about the circuit board 100. The substantially similar stacks or sets of capacitors or capacitor layers 110, 210 that are symmetrical about the circuit board 100 can receive substantially the same electrical signals. The opposing vibrations of the substantially symmetrical halves of the capacitor stacks and/or layers can substantially cancel each other out thus prevent communication of the capacitor vibrations to the circuit board or other supporting structure in the middle of the two stack halves. The opposing vibrations of the substantially identical or symmetrical halves of the capacitor stacks and/or layers can also substantially cancel undesirable electrical noise due to the capacitor vibrations to reduce the effects on signals of interest. This symmetrical or balanced configuration of substantially similar capacitor structures can be used to substantially reduce unwanted audible and/or electrical noise and vibrations from the excited capacitors. The capacitor structures can be discrete capacitors, stacks or sets of capacitors, capacitor layers, or other structures formed using capacitors.

A capacitor array of two or more discrete capacitors, stacks or sets of capacitors, capacitor layers, or other structures formed using capacitors, can be constructed such that the capacitor array is supported by a circuit board or other structure, and a substantially similar capacitor array can be arranged on the opposite side of the supporting structure such that for each capacitor device of the array there is a substantially similar capacitor device on the opposite side of the supporting structure. The terminals of the capacitor arrays can be designed to provide substantially the same electrical stimulation to the capacitor arrays on both sides of the supporting structure. The substantially similar capacitors 110, 210 of FIG. 2 can each represent more complex capacitor arrays in which each of the capacitors 110, 210 represents an array of capacitor devices where for each capacitor device of the capacitor array 110, the capacitor array 210 includes a substantially similar capacitor device mounted on the opposite side of the circuit board 100. The substantially similar capacitor arrays 110, 210 can receive substantially the same electrical signals. The opposing vibrations of the substantially identical capacitor arrays 110, 210 can substantially cancel each other out and thus prevent communication of the capacitor vibrations to the circuit board 100 or other supporting structure. Undesirable noise voltages caused by vibration of the substantially identical capacitor arrays 110, 210 can also substantially oppose one another canceling the undesirable electrical noise effects on signals of interest. This balanced configuration of substantially similar capacitor arrays 110, 210 can be used to substantially reduce unwanted audible and/or electrical noise and vibrations from the excited capacitors. The capacitor arrays can be discrete capacitors, stacks or sets of capacitors, capacitor layers, or other structures formed using capacitors.

Figure 3:
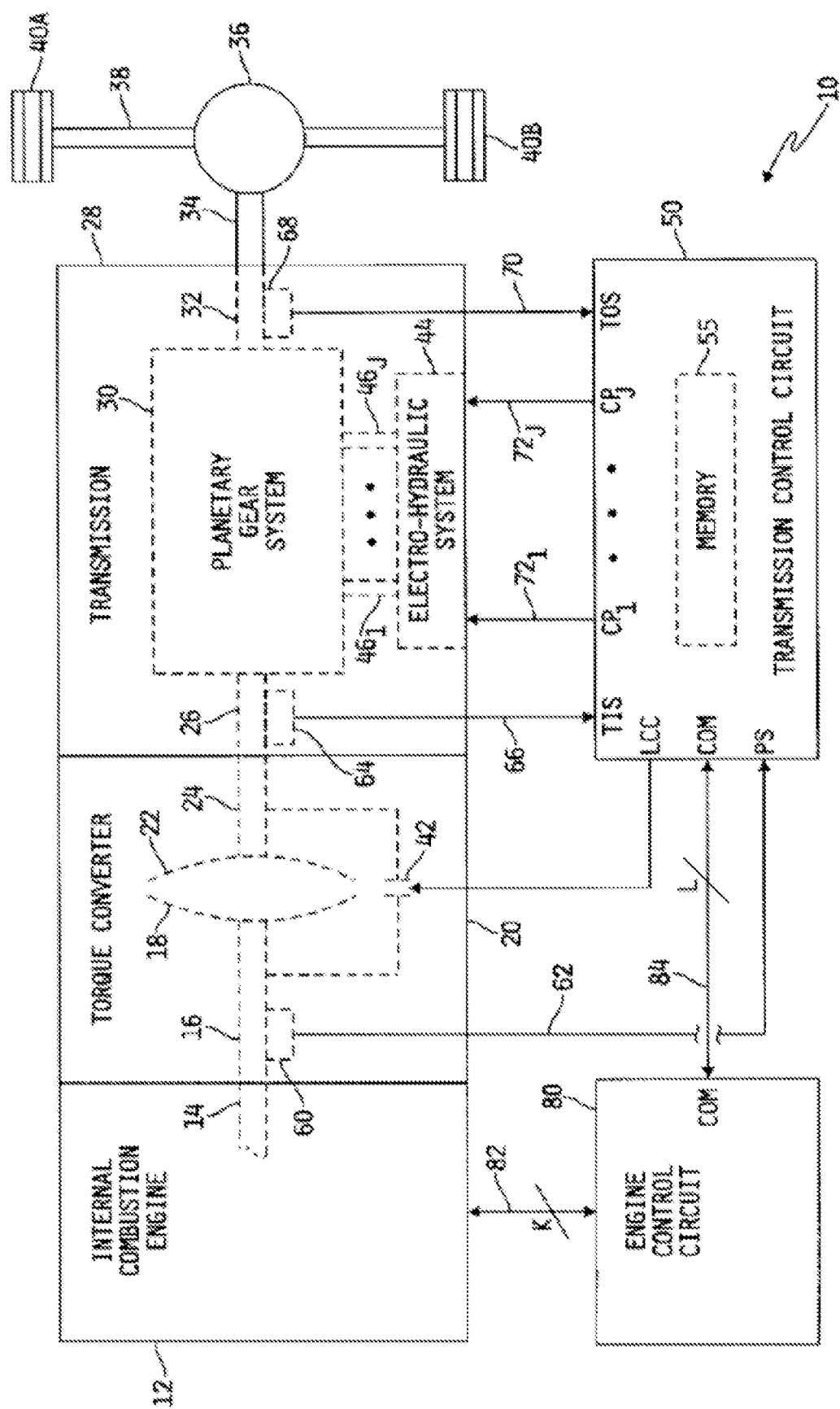
FIG. 3 illustrates an exemplary embodiment of a transmission system in which capacitors could be located on circuit hoards to cancel vibrations and reduce or eliminate unwanted audible and/or electrical noise.

FIG. 3 illustrates an exemplary embodiment of a transmission system 10 in which substantially similar capacitors could be located on opposite sides of circuit boards or supporting structures to cancel vibrations of the supporting structures and reduce or eliminate unwanted vibration and audible or electrical noise. In the illustrated embodiment, the system 10 includes an internal combustion engine 12 that is configured to rotatably drive an output shaft 14 that is coupled to an input or pump shaft 16 of a conventional torque converter 20. The input or pump shaft 16 is attached to an impeller or pump 18 that is rotatably driven by the output shaft 14 of the engine 12. The torque converter 20 further includes a turbine 22 that is attached to a turbine shaft 24, and the turbine shaft 24 is coupled to, or integral with, a rotatable input shaft 26 of a transmission 28. The transmission 28 is conventional and includes, for example, a planetary gear, system 30 having a number of automatically selected gears. An output shaft 32 of the transmission is coupled to or integral with, and rotatably drives, a propeller shaft 34 that is coupled to a differential 36. The differential 36 is coupled to, and rotatably drives, an axle 38 having wheels 40A and 40B mounted thereto at each end. The output shaft 32 of the transmission 28 drives the wheels 40A and 40B in a conventional manner via the propeller shall 34, differential 36 and axle 38.

A conventional lockup clutch 42 is connected between the pump 18 and the turbine 22 of the torque converter 20. The operation of the torque converter 20 is conventional in that the torque converter 20 is operable in a so-called "torque converter" mode during certain operating conditions such as vehicle launch, low speed and certain gear shifting conditions. In the torque converter mode, the lockup clutch 42 is disengaged and the pump 18 rotates at the rotational speed of the engine output shaft 14 while the turbine 22 is rotatably actuated by the pump 18 through a fluid (not shown) interposed between the pump 18 and the turbine 22. In this operational mode, torque multiplication occurs through the fluid coupling such that the turbine shaft 24 is exposed to more drive torque than is being supplied by the engine 12, as is known in the art. The torque converter 20 is alternatively operable in a so-called "lockup" mode during other operating conditions, such as when certain gears of the planetary gear system 30 of the transmission 28 are engaged. In the lockup mode, the lockup clutch 42 is engaged and the pump 18 is thereby secured directly to the turbine 22 so that the engine output shaft 14 is directly coupled to the input shaft 26 of the transmission 28, as is also known in the art.

The transmission 28 further includes an electro-hydraulic system 44 that is fluidly coupled to the planetary gear system 30 via a number, J, of fluid paths $46_1$-$46_J$ where may be any positive integer. The electro-hydraulic system 44 is responsive to control signals to selectively cause fluid to flow through one or more of the fluid paths $46_1$-$46_J$ to thereby control operation, i.e., engagement and disengagement, of a plurality of corresponding friction devices in the planetary gear system 30. The plurality of friction devices may include, but are not limited to, one or more conventional brake devices, one or more torque transmitting devices, and the like. Generally, the operation, i.e., engagement and disengagement, of the plurality of friction devices is controlled by selectively controlling the friction applied by each of the plurality of friction devices, such as by controlling fluid pressure to each of the friction devices. In one exemplary embodiment, which should not be considered to be limiting in any way, the plurality of friction devices includes a plurality of brake and torque transmitting devices in the form of conventional clutches that may each be controllably engaged and disengaged via fluid pressure supplied by the electro-hydraulic system 44. In any case, changing or shifting between the various gears of the transmission 28 is accomplished in a conventional manner by selectively controlling the plurality of friction devices via control of fluid pressure within the number of fluid paths $46_1$-$46_J$.

The system 10 further includes a transmission control circuit 50 that includes a memory unit 55. The transmission control circuit 50 is illustratively microprocessor-based, and the memory unit 55 generally includes instructions stored therein that are executable by the transmission control circuit 50 to control operation of the torque converter 20 and operation of the transmission 28, i.e., shifting between the various gears of the planetary gear system 30. It will be understood, however, that this disclosure contemplates other embodiments in which the transmission control circuit 50 is not microprocessor-based, but is configured to control operation of the torque converter 20 and/or transmission 28 based on one or more sets of hardwired instructions and/or software instructions stored in the memory unit 55.

In the system 10, the torque converter 20 and the transmission 28 include a number of sensors configured to produce sensor signals that are indicative of one or more operating states of the torque converter 20 and transmission 28 respectively. For example, the torque converter 20 illustratively includes a conventional speed sensor 60 that is positioned and configured to produce a speed signal corresponding to the rotational speed of the pump shaft 16, which is the same rotational speed of the output shaft 14 of the engine 12. The speed sensor 60 is electrically connected to a pump speed input, PS, of the transmission control circuit 50 via a signal path 62, and the transmission control circuit 50 is operable to process the speed signal produced by the speed sensor 60 in a conventional manner to determine the rotational speed of the pump shaft 16/engine output shaft 14.

The transmission 28 illustratively includes another conventional speed sensor 64 that is positioned and configured to produce a speed signal corresponding to the rotational speed of the transmission input shaft 26, which is the same rotational speed as the turbine shaft 24. The input shaft 26 of the transmission 28 is directly coupled to, or integral with, the turbine shaft 24, and the speed sensor 64 may alternatively be positioned and configured to produce a speed signal corresponding to the rotational speed of the turbine shaft 24. In any case, the speed sensor 64 is electrically connected to a transmission input shaft speed input, TIS, of the transmission control circuit 50 via a signal path 66, and the transmission control circuit 50 is operable to process the speed signal produced by the speed sensor 64 in a conventional manner to determine the rotational speed of the turbine shaft 24/transmission input shaft 26.

The transmission 28 further includes a speed sensor 68 that is positioned and configured to produce a speed signal corresponding to the rotational speed of the output shaft 32 of the transmission 28. The speed sensor 68 may be conventional, and is electrically connected to a transmission output shaft speed input, TOS, of the transmission control circuit 50 via a signal path 70. The transmission control circuit 50 is configured to process the speed signal produced by the speed sensor 68 in a conventional manner to determine the rotational speed of the transmission output shaft 32.

The transmission 28 further includes one or more actuators configured to control various operations within the transmission 28. For example, the electro-hydraulic system 44 described herein illustratively includes a number of actuators, e.g., conventional solenoids or other conventional actuators, that are electrically connected to a number, J, of control outputs $CP_1$-$CP_J$ of the transmission control circuit 50 via a corresponding number of signal paths $72_1$-$72_J$, where J may be any positive integer as described above. The actuators within the electro-hydraulic system 44 are each responsive to a corresponding one of the control signals $CP_1$-$CP_J$ produced by the transmission control circuit 50 on one of the corresponding signal paths $72_1$-$72_J$ to control the friction applied by each of the plurality of friction devices by controlling the pressure of fluid within one or more corresponding fluid passageways $46_1$-$46_J$, and thus control the operation, i.e., engaging, and disengaging, of one or more corresponding friction devices, based on information provided by the various speed sensors 60, 64 and/or 68. The friction devices of the planetary gear system 30 are illustratively controlled by hydraulic fluid which is distributed by the electro-hydraulic system in a conventional manner. For example, the electro-hydraulic system 44 illustratively includes a conventional hydraulic positive displacement pump (not shown) which distributes fluid to the one or more friction devices via control of the one or more actuators within the electro-hydraulic system 44. In this embodiment, the control signals $CP_1$-$CP_J$ are illustratively analog friction device pressure commands to which the one or more actuators are responsive to control the hydraulic pressure to the one or more frictions devices. It will be understood, however, that the friction applied by each of the plurality of friction devices may alternatively be controlled in accordance with other conventional friction device control structures and techniques, and such other conventional friction device control structures and techniques are contemplated by this disclosure. In any case, however, the analog operation of each of the friction devices is controlled by the control circuit 50 in accordance with instructions stored in the memory unit 55.

In the illustrated embodiment, the system 10 further includes an engine control circuit 80 having an input/output port (I/O) that is electrically coupled to the engine 12 via a number K of signal paths 82, wherein K may be any positive integer. The engine control circuit 80 may be conventional, and is operable to control and manage the overall operation of the engine 12. The engine control circuit 80 further includes a communication port COM which is electrically connected to a similar communication port COM of the transmission control circuit 50 via a number L of signal paths 84, wherein L may be any positive integer. The one or more signal paths 84 are typically referred to collectively as a data link. Generally, the engine control circuit 80 and the transmission control circuit 50 are operable to share information via the one or more signal paths 84 in a conventional manner. In one embodiment, for example, the engine control circuit 80 and transmission control circuit 50 are operable to share information via the one or more signal paths 84 in the form of one or more messages in accordance with a Society of Automotive Engineers (SAE) J-1939 communications protocol, although this disclosure contemplates other embodiments in which the engine control circuit 80 and the transmission control circuit 50 are operable to share information via the one or more signal paths 84 in accordance with one or more other conventional communication protocols.

While exemplary embodiments incorporating the principles of the present invention have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A transmission system, comprising:
   a torque converter including a clutch operably disposed between an engaged position and a disengaged position;
   an input shaft to be rotatably driven by an engine;
   an output shaft for transferring torque to an axle;
   a first sensor coupled to an input of the torque converter to detect a rotational speed input to the torque converter;
   a second sensor coupled to the input shaft to detect a rotational speed of the input shaft;
   a third sensor coupled to the output shaft to detect a rotational speed of the output shaft;
   a planetary gear system including a plurality of friction devices selectively engageable to achieve one of a plurality of ranges;
   an electro-hydraulic system fluidly coupled to the planetary gear system via one or more fluid paths; and
   a transmission control circuit comprising an electronic device adapted to reduce audible or electrical noise from electrically or mechanically excited capacitors, the electronic device including:
      a supporting structure having a top face and a bottom face, the bottom face being opposite the top face;
      a first capacitor device coupled to the top face of the supporting structure; and
      a second capacitor device coupled to the bottom face of the supporting structure substantially opposite of the first capacitor device, the second capacitor device having substantially similar properties to the first capacitor device;
   wherein, the transmission control circuit is disposed in electrical communication with at least the electro-hydraulic system for controlling the transmission system; wherein the first capacitor device and the second capacitor device are symmetrically mounted to the respective top and bottom faces of the supporting structure opposite one another and in alignment with one another to substantially cancel undesirable noise effects resulting from time varying control signals received by the first and second capacitor devices; wherein the transmission control circuit operably controls movement of the clutch between the engaged position and the disengaged position; and wherein the first, second, and third sensors are disposed in electrical communication with the transmission control circuit.

2. The transmission system of claim 1, wherein the first capacitor device is electrically connected in parallel with the second capacitor device.

3. The transmission system of claim 1, wherein the first capacitor device is electrically connected in series with the second capacitor device.

4. The transmission system of claim 1, wherein the first and second capacitor devices are discrete capacitors.

5. The transmission system of claim 1, wherein the first and second capacitor devices are ceramic capacitors.

6. The transmission system of claim 1, wherein the supporting structure is a circuit board.

7. The transmission system of claim 1, wherein the first capacitor device comprises a first stack of multiple capacitors, and the second capacitor device comprises a second stack of multiple capacitors.

8. The transmission system of claim 7, wherein the first stack of multiple capacitors and the second stack of multiple capacitors are substantially symmetrical with one another about the supporting structure.

9. The transmission system of claim 1, wherein the first capacitor device comprises a first stack of capacitor layers, and the second capacitor device comprises a second stack of capacitor layers.

10. The transmission system of claim 9, wherein the first stack of capacitor layers and the second stack of capacitor layers are substantially symmetrical with one another about the supporting structure.

11. The transmission system of claim 1, wherein the first capacitor device comprises a first array of multiple capacitor devices, and the second capacitor device comprises a second array of multiple capacitor devices.

12. The transmission system of claim 11, wherein for each individual capacitor device of the first capacitor array, the second capacitor array includes a substantially similar capacitor device, the substantially similar capacitor device of the second capacitor array being coupled on the opposite side of the supporting structure substantially opposite from the individual capacitor device of the first capacitor array.

* * * * *